United States Patent [19]

Shin et al.

[11] Patent Number: 6,146,077
[45] Date of Patent: Nov. 14, 2000

[54] WAFER TRANSFER SYSTEM OF SEMICONDUCTOR FABRICATING EQUIPMENT USING A SERIAL NUMBER DETECTING DEVICE

[75] Inventors: Kwang-hee Shin; Seung-kun Lee, both of Kyonggi-do, Rep. of Korea

[73] Assignee: Samsung Electronics Co., Ltd., Suwon, Rep. of Korea

[21] Appl. No.: 09/006,441

[22] Filed: Jan. 13, 1998

[51] Int. Cl.[7] ................................. H01L 21/02
[52] U.S. Cl. .................... 414/404; 414/416; 414/274; 414/222.02; 414/225.01; 414/937; 414/941; 901/47; 364/478.03; 364/478.14; 364/478.06; 364/478.16; 235/462
[58] Field of Search ................ 118/719; 364/478.06, 364/478.16, 478.13, 478.03, 478.14, 478.15; 414/937, 938, 941, 207, 404, 403, 416, 273, 222.02, 225.01, 787, 274; 901/46, 47; 235/462

[56] References Cited

U.S. PATENT DOCUMENTS

| 5,308,222 | 5/1994 | Bacchi et al. | 414/936 X |
| 5,975,836 | 11/1999 | Rodriguez | 414/937 X |

FOREIGN PATENT DOCUMENTS

| 62-47143 | 2/1987 | Japan | 414/937 |
| 62-145831 | 6/1987 | Japan | 414/937 |
| 4-96217 | 3/1992 | Japan | 414/937 |
| 5-114641 | 5/1993 | Japan | 414/937 |
| 6-144522 | 5/1994 | Japan | 414/937 |

*Primary Examiner*—Frank E. Werner
*Attorney, Agent, or Firm*—Jones Volentine, LLC

[57] ABSTRACT

A wafer transfer system of semiconductor fabricating equipment is capable of successively arranging a plurality of wafers in a designated order (e.g., an ascending order, a descending order, an odd/even number order or an individual selection order). The wafer transfer system includes a first cassette containing the wafers, and a second cassette for receiving the wafers. A wafer transfer robot having a wafer transfer arm moves the wafers from the first cassette to the second cassette, after the wafer serial numbers have been read and sent to a computer. The computer uses a selected wafer arrangement order to decide where within the second cassette each wafer from the first cassette should be placed and then controls the wafer transfer robot to place each wafer into the desired location. With the wafers arranged in the selected order, it is not necessary to test each wafer after each fabricating process. Instead, several wafers can be selectively tested at suspected weak points, while changes in the properties of the fabricating processes can still be detected. Testing time is thereby saved, and productivity is improved.

51 Claims, 5 Drawing Sheets

| Slot no. | Ascending order | Descending order | Odd/even number order | Individual selection order |
|---|---|---|---|---|
| slot #25 | #25 | #01 | | |
| slot #24 | #24 | #02 | | |
| slot #23 | #23 | #03 | | |
| slot #22 | #22 | #04 | | |
| ... | ... | ... | | |
| slot #03 | #03 | #23 | #05 or #06 | #24 |
| slot #02 | #02 | #24 | #03 or #04 | #07 |
| slot #01 | #01 | #25 | #01 or #02 | #04 |

FIG. 9

WAFER TRANSFER SYSTEM OF SEMICONDUCTOR FABRICATING EQUIPMENT USING A SERIAL NUMBER DETECTING DEVICE

BACKGROUND OF THE INVENTION

1. Field of the Invention

The present invention relates to a system for transferring wafers in semiconductor fabricating equipment. More particularly, it relates to a wafer transfer system including a serial number detecting device that recognizes wafer numbers marked on the wafers and automatically arranges the wafers in a predetermined order (e.g., an ascending order, a descending order, an odd/even number order or an individual selection order).

2. Background of the Related Art

Semiconductor fabricating equipment has undergone continued remarkable development and has entered an era of intricate, various and automated functioning capable of advanced control. Complex semiconductor fabrication processes are now possible. It is the semiconductor fabricating equipment which determines the properties of the semiconductor products; and high technology fabrication depends on the quality of the semiconductor fabrication equipment.

Therefore, reliability of the equipment is necessary in order to thoroughly perform hundreds of processes for fabricating semiconductor devices under designated conditions. The processes have respective unique parameters and procedures. Numerous factors that may affect the process condition can be generated while semiconductor devices move through these many processes.

Each unit process among the hundreds of processes is carried out, not independently, but in relation to each other unit process in order to produce a finished product. Upon completion of a unit process, a test step is provided to ascertain whether or not the preceding unit process was normally performed. Thereafter, the results from the test are verified. In such a manner, the unit processes are continuously performed. In this case, the reliability of the equipment has much more importance because a highly integrated semiconductor device is being fabricated.

The importance of reliability will be described in relation to a dry-etching process, which is widely used in semiconductor fabrication. For description purposes, two control points are designated. The two control points are input factors and output factors. Based on these control points, the influence that the equipment has on semiconductor fabrication will be discussed below. The technique using these two control points is known as statistical process control. The input factors and the output factors are shown in Table 1.

In Table 1, the input factors represent the mechanical aspect of the equipment for performing dry etching; and the output factors represent the properties of a product (e.g., a patterned film on a wafer) produced by the dry etching process.

Referring to Table 1, it is noted that the output factors, that is, critical dimension, the etch rate, etc. of the patterned film, are determined by the process condition of the input factors. In the event that reliability of the equipment is not achieved, the result is deterioration of the output factors.

Figure 1:
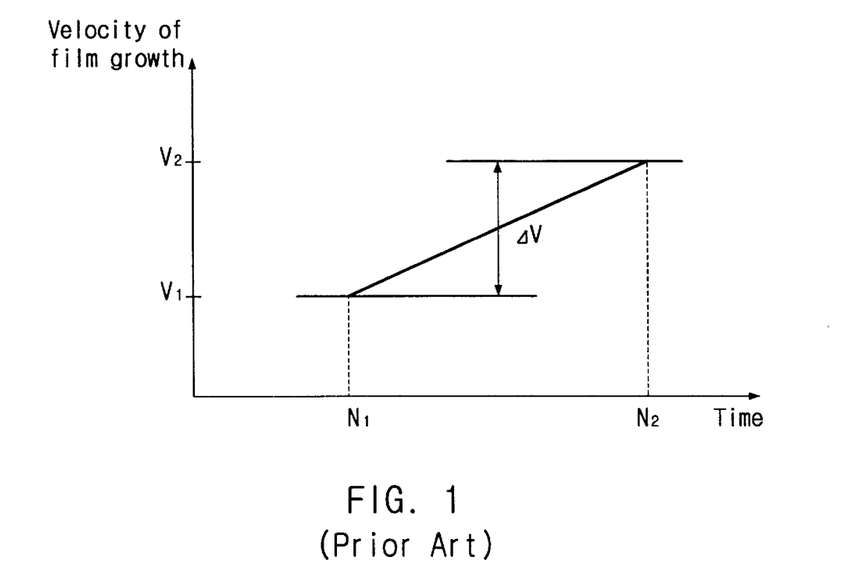
FIG. 1 is a graph showing the relationship between time and film growth when a film grows on a plurality of wafers in a conventional batch technique.

FIG. 1 shows the relationship between time and film growth when the film grows on a plurality of wafers in a batch technique. $N_1$ through $N_x$ represent the respective wafer numbers.

Referring to the graph of FIG. 1, the film initially grows at the velocity of $V_1$ on the wafer $N_1$. As time elapses, the film grows on the wafer $N_x$, and the temperature in a reaction chamber in which the film grows on the wafers is gradually increased in association with RF (Radio Frequency) heating. As a result, the velocity $V_1$ is changed by $\Delta V$. The resultant velocity is shown as $V_2$ in the drawing. The change in the velocity of the film growth causes differences between the thicknesses of the resultant films on the wafers, which results in process degradation.

Upon completion of a unit process, the wafer is subjected to a test step. If the test shows that the thickness of the film is not in the range of a reference thickness (e.g., a set value ±0.5%), the wafer having the film is rejected. Otherwise, if the thickness is in the range of the reference thickness, the wafer is transferred to the next process in the sequence of processes.

When the wafer has a film thickness that is not the same as the set value but is in the range of the reference thickness, the wafer is transferred to the next process anyway. In this case, however, the wafer may encounter difficulties later on in the fabrication process. In particular, if the wafer is rejected during any test following a subsequent unit process, it is difficult to identify which equipment or which process caused the degradation of the quality of the wafer which lead to the rejection.

That is why wafers are randomly processed and loaded into a cassette without any designated order (e.g., an order based on the wafer numbers marked on the wafers). Rather, the wafers are loaded into the cassette when they have completed a respective unit process.

Hundreds of processes using batch techniques and single techniques ( i.e., one by one) make the wafer processing order much more random. The batch technique is generally applied to, for example, a process using a diffusion furnace. The single technique is used, for example, for a dry etching process or an ion implantation process. A CVD (Chemical

TABLE 1

Input Factors and the Output Factors for Semiconductor Fabrication

| | | | |
|---|---|---|---|
| Input Factors | Equipment | Gas, Temperature, Pressure, High-frequency Wave, Etc. | Highly Influenced by the Mechanism |
| | Environment | Temperature, Purity, Humidity, Etc. | |
| | Method | Process Sequence, Time in an Etching Chamber, Etc. | |
| Output Factors | Test | Critical Dimension, Etch Rate, Process Dissemination, Defects, Profile State, Etc. | Results from Process Verification |

Vapor Deposition) process uses a partial batch technique. In the partial batch technique, wafers are introduced into the fabricating equipment in the batch manner, while they are processed in the single manner.

When the wafers are randomly loaded into the cassette, it is impossible to determine a relationship between the causes of the process degradation that are generated during the respective unit processes and the input factors of the fabricating equipment using only the poor quality wafer.

Therefore, further research and development for solving the above and other problems is required to thoroughly understand the relationship between the input factors, i.e., the properties of the equipment, and the output factors, i.e., the properties of the products.

SUMMARY OF THE INVENTION

According to the present invention, it is possible to clearly determine the state of fabricating equipment during respective unit processes by checking the history of the fabricating equipment when a process degradation occurs using a technique capable of automatically arranging wafers in a specified order.

Therefore, the present invention provides a wafer transfer system of semiconductor fabricating equipment capable of clearly detecting any changes in the unique properties of the equipment during the respective unit processes and any change in the process properties in association with the continuity of the processes, by means of automatically arranging the wafers of a run unit in a designated order (an ascending order, a descending order, an odd/even number order or an individual selection order), for every unit process using the equipment, and a method for transferring the wafers using the wafer transfer system.

The wafer transfer system comprises: a system body; a first cassette support installed at a predetermined position on the system body; a first cassette loaded on the first cassette support and containing a plurality of wafers; a serial number detecting device, installed on the system body at a first side of the first cassette and vertically movable; a second cassette support, installed on the system body and spaced apart by a predetermined distance from the serial number detecting device, the second cassette support being vertically movable; a second cassette, loaded on the second cassette support for receiving the plurality of wafers; and a wafer transfer robot for transferring the plurality of wafers from the first cassette to the second cassette, installed on the system body at a second side of the first cassette opposite to the first side, and vertically movable.

The serial number detecting device has a support bar and a character recognizing part attached at a predetermined location on the support bar. The wafer transfer robot has a wafer transfer arm on which the wafer is loaded and a support attached to the wafer transfer arm in a direction perpendicular thereto. Preferably, the serial number detecting device has a height range of from 40 to 50 cm. Preferably, the wafer transfer arm has a length range of from 33 to 37 cm. The character recognizing part is fixed on the support bar in such a way that it is sloped by 45° with respect to the horizontal surface on which the plurality of wafers is placed. The wafer transfer arm is designed to be horizontally movable.

The wafer transfer robot may be installed on the system body between the second cassette and the serial number detecting device. A third cassette support for supporting a third cassette also for receiving the plurality of wafers may be further installed on the system body. The third cassette support is located on a line perpendicularly extending from the center point of the line connecting the open sides of the first and second cassettes. The first, second and third cassettes are located on the system body at the same distances from the center point.

In this embodiment, the wafer transfer arm of the wafer transfer robot preferably has a length range of from 22 to 24 cm. The wafer transfer robot is rotatable up to 180°.

When the wafers are arranged in a designated order (an ascending order, a descending order, an odd/even number order or an individual selection order) using the wafer transfer system, it is not necessary to test all the wafers after each respective unit process. An operator need only test several wafers at weak points (e.g., $22^{nd}$ through $24^{th}$ wafers). As a result, it is possible to reduce the time required for the test. Furthermore, it is possible to clearly detect changes in the properties of processes in association with the continuity of the unit processes by automatically arranging the wafers in the designated order based on the method for handling the wafers for the repeated unit processes.

Further features and advantages of the invention will be apparent from the specification and from the drawings.

BRIEF DESCRIPTION OF THE ATTACHED DRAWINGS

The accompanying drawings illustrate embodiments of the invention, in which.

DETAILED DESCRIPTION OF PREFERRED EMBODIMENTS

The wafer transfer system according to the present invention will be hereinafter described in detail, referring to the accompanying drawings.

Figure 2:
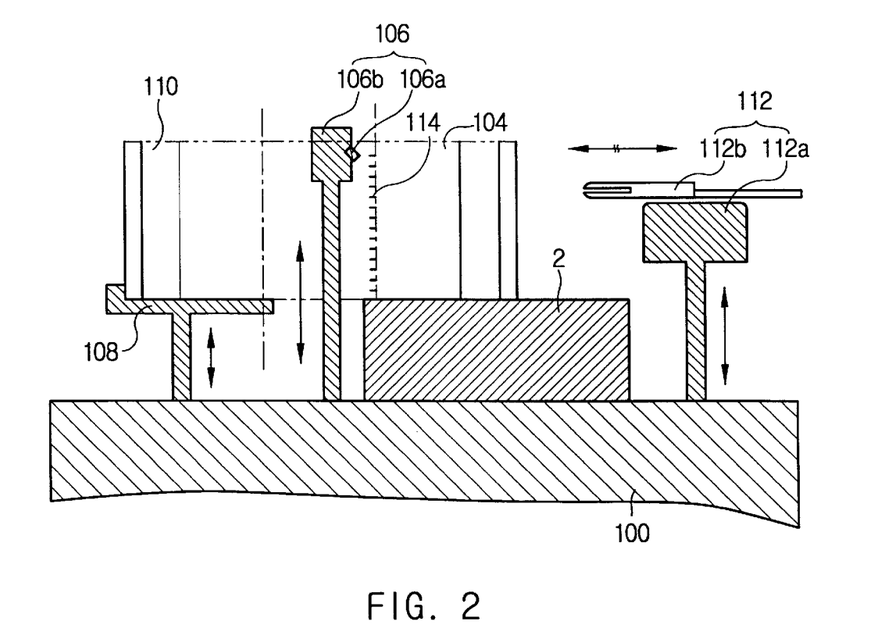
FIG. 2 is a cross-sectional view of a first embodiment of the wafer transfer system of semiconductor fabricating equipment according to the present invention.

FIG. 2 is a cross-sectional view of a first embodiment of the wafer transfer system of semiconductor fabricating equipment according to the present invention, which is capable of automatically arranging wafers in a designated order.

Figure 6:
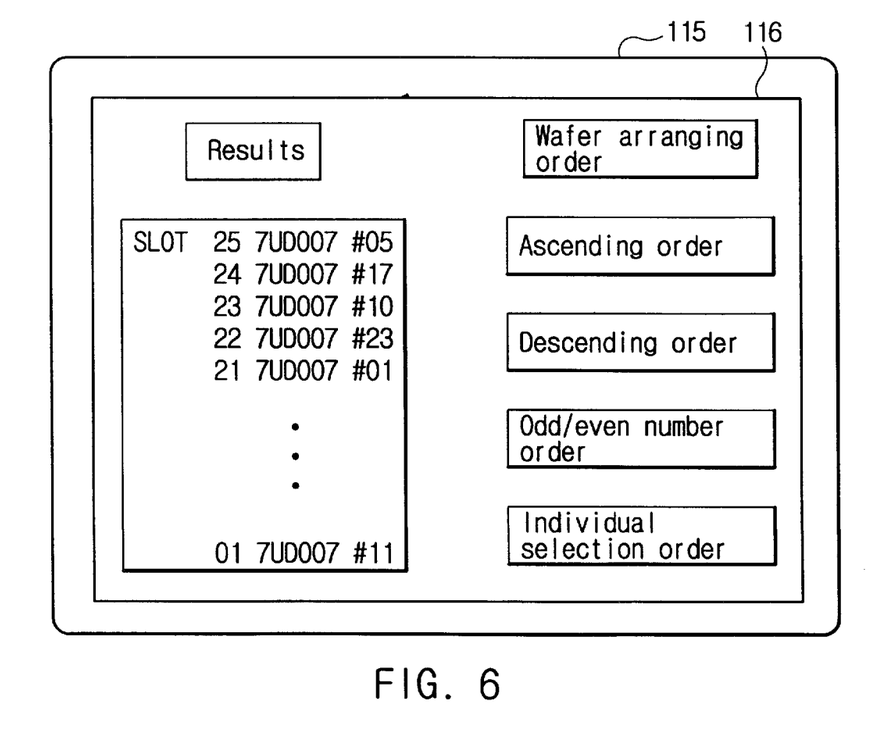
FIG. 6 is an illustration of a computer monitor displaying the results from the detection by the serial number detecting device of the wafer transfer system of FIG. 2.

Referring to FIG. 2, the wafer transfer system includes a system body 100. A first cassette support 102 is installed at a predetermined position on the system body 100. On the first cassette support 102, a first cassette 104 containing a plurality of wafers 114 (e.g., 25 wafers) is loaded. A serial number detecting device 106 is provided on a side of the first cassette 104 on the system body 100. The serial number detecting device 106 is provided with gears for vertical movement. A second cassette support 108 is installed on the system body 100 and spaced apart from the serial number detecting device 106. The second cassette support 108 is also provided with gears for vertical movement. A second cassette 110, for receiving wafers, is loaded on the second cassette support 108. A wafer transfer robot 112 is installed on the other side of the first cassette 104 on the system body 100. The wafer transfer robot 112 is also provided with gears for vertical movement. The wafer transfer system is connected to a computer 115, the monitor 116 of which is shown in FIG. 6, by a network system.

Figure 3:
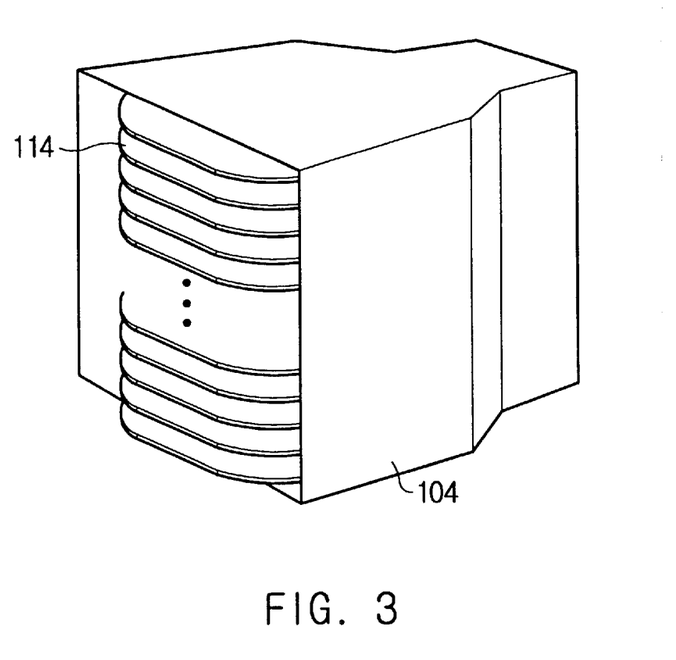
FIG. 3 is a perspective view of a first cassette of the wafer transfer system of FIG. 2, containing 25 wafers of a run unit.
Figure 4:
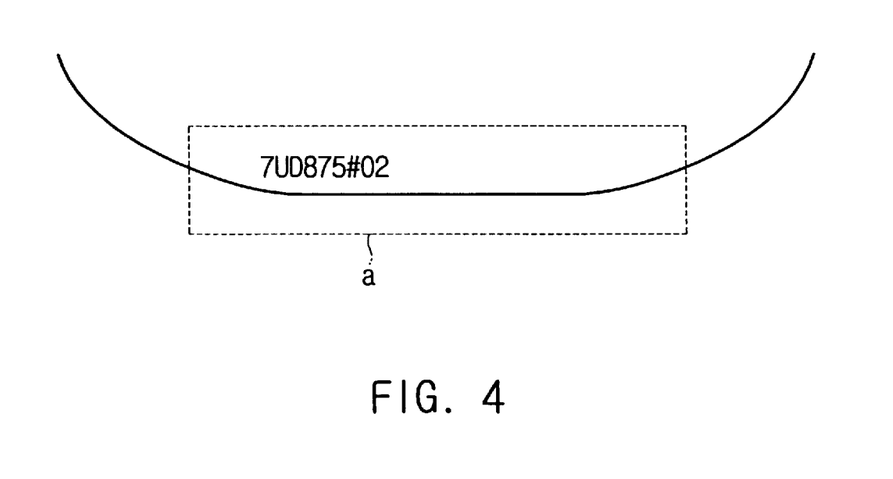
FIG. 4 is a closeup view of the flat zone of one of the wafers of FIG. 3.

Referring to FIG. 3, the 25 wafers 114 of a run unit are loaded in slots ($1^{St}$ through $_{25}^{th}$ slots) of the first cassette 104. Wafer serial numbers (e.g., an individual number #02 and a lot name 7UD875) are marked on the respective flat zones of the wafers 114 as shown in FIG. 4.

Figure 5:
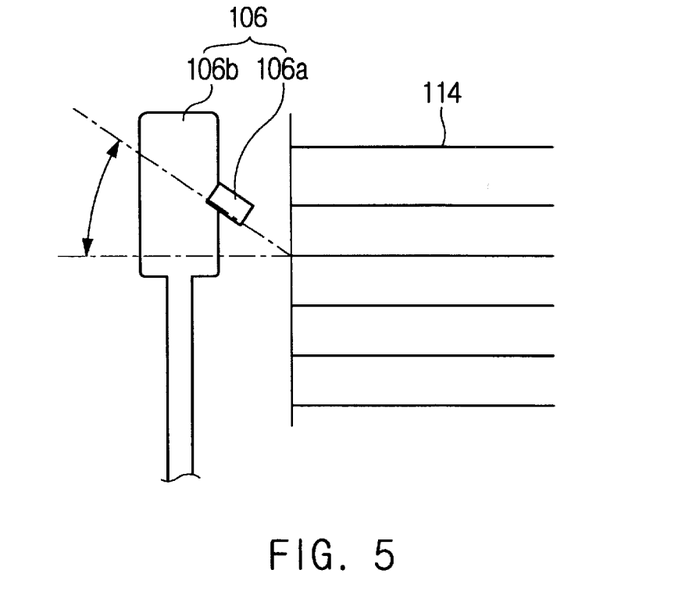
FIG. 5 is a schematic diagram for explaining the method for detecting wafer serial numbers using a serial number detecting device of the wafer transfer system of FIG. 2.

The serial number detecting device has a height range of from 40 to 50 cm and includes a support bar 106b installed on the system body 100 and a character recognizing part 106a attached at a predetermined position on the support bar 106b. The character recognizing part 106a is fixed onto the support bar 106b in such a way that the character recognizing part 106a is sloped by 45° with respect to the horizontal surface on which the wafer 114 is placed as shown in FIG. 5. As a result, the serial number detecting device 106 can easily detect the wafer serial numbers marked on the wafers loaded in the slots of the first cassette 104 with a predetermined pitch.

The wafer transfer robot 112 has a support 112a installed on the system body 100 and a wafer transfer arm 112b loaded on the top of the support 112a. The wafer transfer arm 112b is designed to be able to move horizontally back and forth. The wafer transfer arm 112b has a length range of from 33 to 37 cm. The support 112a has a height range of from 28 to 30 cm.

The first cassette 104 has an open side which is located opposite of an open side of the second cassette 110 on the system body 100. As a result, the wafer 114 in the slot of the first cassette 104 can be transferred to a predetermined slot of the second cassette 110 by horizontally moving the wafer transfer arm 112b in such a way that the wafer 114 in the first cassette 104 is pushed and inserted into the slot of the second cassette 110.

The wafer transfer system operates through the following steps.

As a preparatory step, the number of wafers in the run unit is counted. In other words, it is determined whether or not the first cassette 104 contains a run unit of 25 wafers 114. In the event there is any slot without a wafer, the wafer in the subsequent slot is moved into the empty slot by the wafer transfer robot 112. In this way, the wafers are initially arranged.

As a first step, the wafer serial numbers marked on the wafers 114 loaded in the first cassette 104 are successively detected by the character recognizing part 106a of the serial number detecting device 106. The result of the detection, i.e., the serial numbers of the wafers, is displayed on monitor 116 of computer 115 connected to the wafer transfer system by the network system. All the wafers 114 have the same lot name 7UD007 because all of them are in the first cassette 104.

The serial number detecting device 106 moves down and, at the same time, the character recognizing part 106a detects the wafer serial numbers (individual numbers and lot names) marked on the flat zones of the wafers 114 from the $1^{st}$ to the $25^{th}$ slot of the first cassette 104, in a manner, for example, such as that used when a facsimile head reads and scans a character image marked in a specific area.

The process begins with the preparatory wafer counting step, which takes place prior to the first step, which is the wafer number detecting step. The wafer counting step is adapted for reducing the time for moving the wafers, but may be omitted.

As a second step, a wafer arranging order is selected among possible orders (an ascending order, a descending order or an individual selection order) which are set in the computer 115.

As a third step, the wafer transfer robot 112 transfers the wafers in the first cassette 104 to respectively designated slots in the second cassette 110 under the condition that the serial number detecting device 106 is moved down to a predetermined depth of the system body 100 as determined by the results displayed on the computer monitor 116. The respectively designated slots in the second cassette 110 are determined by the wafer arranging order selected in the second step.

This third step will be described in detail with reference to an embodiment in which wafers are arranged in ascending order.

First, the wafer 114 loaded in the $25^{th}$ slot of the first cassette 104, which has an individual #5, is loaded onto the wafer transfer arm 112b of the wafer transfer robot 112. Thereafter, the second cassette support 108 is moved up to the height that the #5 wafer 114 can be horizontally transferred to the designated slot (e.g., #5 slot) of the second cassette 110. Under this condition, the wafer transfer arm 112b having the #5 wafer 114 thereon is moved toward the second cassette 110, so that the #5 wafer 114 is transferred into the designated slot (e.g., #5 slot) of the second cassette 110.

The aforementioned operation is repeatedly applied to the rest of the wafers 114 loaded in the first cassette 104. As a result, all the wafers 114 in the first cassette 104 are transferred to the second cassette 110 in the selected wafer arranging order (e.g., an ascending order).

In the case that the aforementioned wafer transfer operation is performed for every unit process in the fabrication process sequence, it is possible to clearly detect any changes in the properties of the processes in association with continuity of the unit processes. Moreover, it is possible to analyze the properties of the unit processes and it is accordingly possible to easily analyze the state of the semiconductor fabrication equipment.

Figure 7:
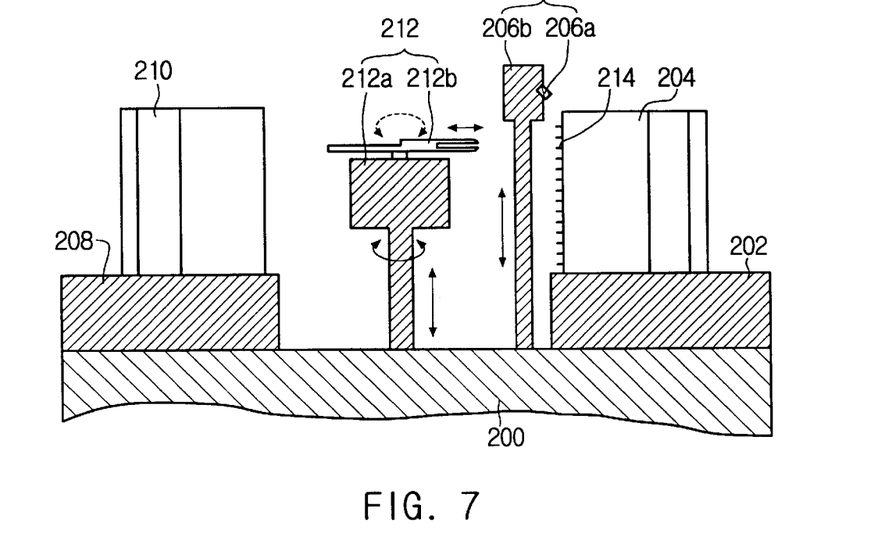
FIG. 7 is a cross-sectional view of a second embodiment of the wafer transfer system of semiconductor fabricating equipment according to the present invention.

FIG. 7 is a cross-sectional view of a second embodiment of the wafer transfer system according to the present invention, which includes a wafer transfer robot installed on a system body between first and second cassettes.

Referring to FIG. 7, the wafer transfer system includes first and second cassette supports 202 and 208 installed on a system body 200, spaced apart from each other by a predetermined distance. A first cassette 204 containing a plurality of wafers 214 is loaded on the first cassette support 202. On the second cassette support 208, a second cassette 210 for receiving the wafers is loaded. A wafer transfer robot 212 is installed on the system body 200 between the first and the second cassettes 204 and 210. The wafer transfer robot 212 is provided with gears for rotation and vertical movement. A serial number detecting device 206 is installed on the system body 200 between the wafer transfer robot 212 and the first cassette 204. The serial number detecting device 206 is also provided with gears for vertical movement. The wafer transfer system is connected to a computer 115 by a network system.

The wafer transfer robot 212 has a support 212a and a wafer transfer arm 212b, and in these aspects is the same as the wafer transfer robot 112 of the first embodiment. However, wafer transfer robot 212 is different from wafer transfer robot 112 of the first embodiment in that the wafer transfer robot 212 can vertically move and rotate by 180°. The wafer transfer arm 212b is able to horizontally move back and forth, and has a length range of from 22 to 24 cm. The support 212a has a height range of from 28 to 30 cm.

The wafer transfer arm 212b of the second embodiment is shorter than the wafer transfer arm 112b of the first embodiment because the distance between the wafer transfer robot 212 and the first and the second cassettes 204 and 210 is minimized by installing the wafer transfer robot 212 at the center of the space between the cassettes 204 and 210.

The serial number detecting device 206 includes basically the same elements, i.e., a support bar 206b and a character recognizing part 206a, as previously described in the first embodiment. The total height of the serial number detecting device 206 ranges from 40 to 50 cm. The character recognizing part 206a is fixed on the support bar 206b in such a way that it is sloped by 45° with respect to the horizontal surface that the wafer 214 is placed on. The first cassette 204 is installed on the system body 200 with its open side opposite the open side of second cassette 210.

The wafer transfer robot 212 may be modified to include a support 212a that is only vertically movable, and a wafer transfer arm 212b that is vertically movable as well as rotatable. In this modification, the wafer transfer arm 212b is designed to rotate by 180°.

The second embodiment of the wafer transfer system operates through the following steps.

As a preparatory step, the number of wafers in the run unit is counted in the same manner as in the preparatory step of the first embodiment. If it is determined that there is any slot without a wafer, the wafer in the subsequent slot is moved into the empty slot by the wafer transfer robot 212. In this way, the wafers are initially arranged.

In a first step, the wafer serial numbers marked on the wafers 214 loaded in the first cassette 204 are successively detected by the character recognizing part 206a of the serial number detecting device 206. The result of the detection, i.e., the detected serial numbers, is displayed on monitor 116 of computer 115 connected to the wafer transfer system by a network system. The monitor 116 displaying the results is shown in FIG. 6.

The serial number detecting device 206 moves down and, at the same time, the character recognizing part 206a detects the wafer serial numbers marked on the flat zones of the wafers 114 from the 1$^{st}$ to the 25$^{th}$ slot of the first cassette 204, in a manner, for example, such as that used when a facsimile head reads and scans a character image marked in a specific area. It is also possible to omit the wafer counting preparatory step as in the first embodiment.

As a second step, a wafer arranging order is selected among possible orders (an ascending order, a descending order or an individual selection order) which are set in the computer 115.

As a third step, the wafer transfer robot 212 transfers the wafers in the first cassette 204 to respectively designated slots in the second cassette 210 under the condition that the serial number detecting device 206 is moved down to a predetermined depth of the system body 200 as determined by the results displayed on the computer monitor 116. The respectively designated slots in the second cassette 210 are determined by the wafer arranging order selected in the second step.

The third step will be described in detail with reference to an embodiment in which the wafers are to be arranged in ascending order.

First, the wafer 214 loaded in the 25$^{th}$ slot of the first cassette 204, which has an individual #5, is loaded onto the wafer transfer arm 212b of the wafer transfer robot 212. Thereafter, the wafer transfer robot 212 on which the #5 wafer 214 is loaded is moved to a height such that the #5 wafer 214 can be horizontally transferred to the designated slot (e.g., #5 slot) of the second cassette 210. The wafer transfer robot 212 then rotates by 180°. Under this condition, the wafer transfer arm 212b on which the #5 wafer 214 is loaded is moved toward the second cassette 210, so that the #5 wafer 214 is transferred into the designated slot (e.g., #5 slot) of the second cassette 210.

The aforementioned operation is repeatedly applied to the rest of the wafers 214 loaded in the first cassette 204. As a result, all the wafers 214 in the first cassette 204 are transferred to the second cassette 210 in the selected wafer arranging order (e.g., an ascending order).

In the case where the wafer transfer robot 212 has a support that is only vertically movable and not rotatable, and wafer transfer arm 212b that is vertically movable as well as rotatable (see "dashed" rotating arrow in FIG. 7), the operation thereof is as described below. The preparatory step and the first, and second steps are the same as previously described for the second embodiment. Therefore, the description thereof will be omitted and the third step will be described below, with reference to wafers arranged in an ascending order.

First, the #5 wafer 214 loaded in the 25$^{th}$ slot of the first cassette 204 is loaded onto the wafer transfer arm 212b of the wafer transfer robot 212 under the condition that the serial number detecting device 206 is vertically moved down to a predetermined depth of the system body 200. The wafer transfer robot 212 on which the #5 wafer 214 is loaded is moved to a height such that the #5 wafer 214 can be horizontally transferred to the designated slot (e.g., #5 slot) of the second cassette 210.

Thereafter, the support 212a of the wafer transfer robot 212 is not rotated, but the wafer transfer arm 212b is rotated by 180° (see "dashed" rotating arrow in FIG. 7). Under this condition, the wafer transfer arm 212b, on which the #5 wafer 214 is loaded, is moved toward the second cassette 210, so that the #5 wafer 214 is transferred into the designated slot (e.g., #5 slot) of the second cassette 210.

The aforementioned operation is repeatedly applied to the rest of the wafers 214 loaded in the first cassette 204. As a result, all the wafers 214 in the first cassette 204 are transferred to the second cassette 210 in the selected wafer arranging order (e.g., an ascending order).

Figure 8:
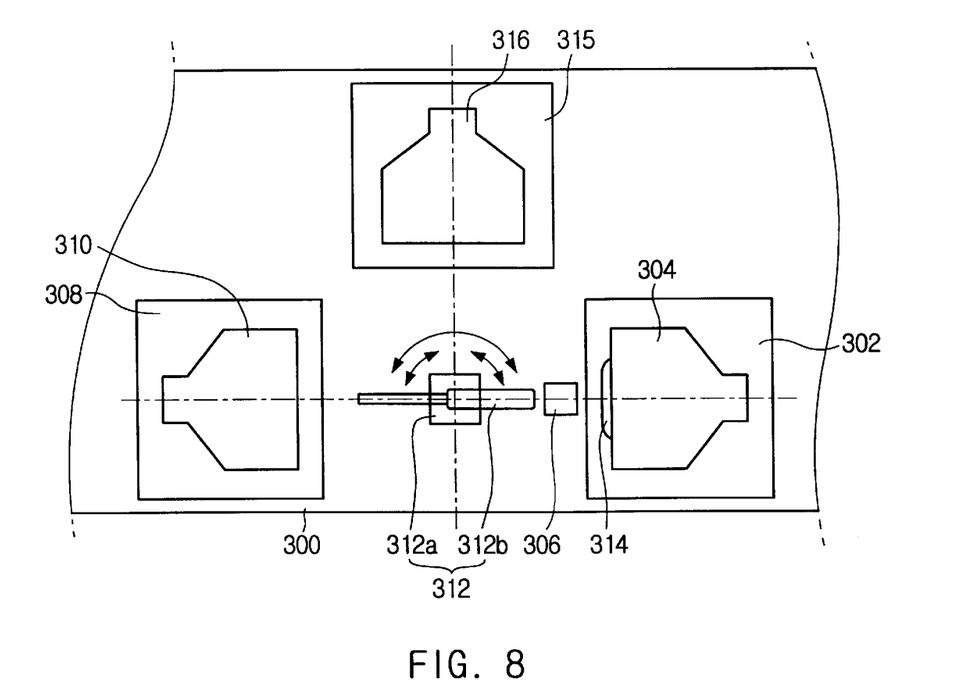
FIG. 8 is a top view of a third embodiment of the wafer transfer system of semiconductor fabricating equipment according to the present invention.

FIG. 8 is a top view of a third embodiment of the wafer transfer system according to the present invention. In this embodiment, the wafer transfer system includes a wafer transfer robot on the system body between the first and the second cassettes and further includes a third cassette at a predetermined position spaced apart from the first and second cassettes by a predetermined distance. The embodiment is shown with a top view for easier description purposes and the detailed description thereof is as follows.

Referring to FIG. 8, the wafer transfer system includes a system body 300. On the system body 300, first, second and third cassette supports 302, 308 and 315 are installed, which are spaced apart from each other by predetermined distances. A first cassette 304 containing a plurality of wafers 314 (e.g., 25 wafers) is loaded on the first cassette support 302. On the second and the third cassette support 308 and 315, second and third cassettes 310 and 316 are respectively loaded for receiving the wafers. A wafer transfer robot 312 is installed on the system body 300 between first and second cassettes 304 and 310. The wafer transfer robot 312 is provided with gears for rotation and vertical movement. A serial number detecting device 306 is installed on the system body 300 between the wafer transfer robot 312 and the first cassette 304. The serial number detecting device is provided with gears for vertical movement. The wafer transfer system is connected to a computer 115 by a network system.

The first cassette 304 has an open side which is located opposite the open side of second cassette 310 on the system body 300. The location of the third cassette 316 is determined by establishing a first line connecting the centers of the open ends of the first and second cassettes, and a second line perpendicular to and crossing the center point of the first line. The third cassette 316 is located on the second line. The first, second and third cassettes 304, 310 and 316 are located on the system body 300 at the same distance from the center point.

By installing the first, second and third cassettes 304, 310 and 316 at the same distance from the center point, the wafer transfer robot 312 that is installed at the center point can accurately move the wafers 314 from/to the cassettes 304, 310 and 316 by moving vertically and rotating.

Such empty cassettes 310 and 316 loaded on the system body 300 make it easier to arrange the wafers in a designated order, more particularly, in an individual number order that is designated by an operator, or in an odd/even number order.

The wafer transfer robot 312 has a support 312a and a wafer transfer arm 312b, and in these aspects is the same as the wafer transfer robots 112 and 212 of the first and the second embodiments. However, wafer transfer robot 312 is different from the wafer transfer robots 112 and 212 of the first and the second embodiments in that it can vertically move and rotate by 90° as well as 180°. The wafer transfer arm 312b is able to move back and forth horizontally, and has a length range of from 22 to 24 cm. The support 312a has a height range of from 28 to 30 cm.

The wafer transfer arm 312b of the third embodiment is shorter than the wafer transfer arm 112b of the first embodiment because the distances between the wafer transfer robot 312 and first, second and third cassettes 304, 310 and 316 is minimized by installing the wafer transfer robot 312 at the center point of the space defined by the cassettes 304, 310 and 316.

The serial number detecting device 306 includes a support bar and a character recognizing part as shown in the schematic diagram of FIG. 5 and has a total height range of from 40 to 50 cm. The character recognizing part is fixed to the support bar in such a way that it is sloped by 45° with respect to the horizontal surface that the wafers are placed on.

The wafer transfer robot 312 may be modified to include a support 312a that is only vertically movable, and a wafer transfer arm 312b that is vertically movable as well as rotatable. In this modification, the wafer transfer arm 312b is designed to rotate by 90° as well as 180°. When the wafer transfer arm 312b is rotated by 90°, the wafer transfer arm 312b is turned toward the third cassette 316. On the other hand, when the wafer transfer arm 312b is rotated by 180°, the wafer transfer arm 312b is turned toward the second cassette 310.

The third embodiment of the wafer transfer system operates through a preparatory step and then three steps as follows. The preparatory step and the first and second steps are the same as previously described with respect to the second and the third embodiments. Therefore, the description thereof will be simple and only the third step will be described in detail below.

As a preparatory step, the number of wafers in the run unit is counted. If it is determined that there is any slot in the first cassette 304 without a wafer, the wafer in the subsequent slot is moved into the empty slot by the wafer transfer robot 312. In this way, the wafers are initially arranged. However, it is possible to omit this preparatory wafer counting step.

In a first step, the wafer serial numbers marked on the wafers 314 loaded in the first cassette 304 are successively scanned and detected by the character recognizing part of the serial number detecting device 306. The result of the detection, i.e., the detected serial numbers, is displayed on a computer monitor 116.

As the second step, a wafer arranging order is selected among possible orders (an odd/even number order, or an individual selection order) which are set in the computer 115.

As the third step, the wafer transfer robot 312 transfers the wafers in the first cassette 304 to respectively designated slots in the second cassette 310 and/or the third cassette 316 under the condition that the serial number detecting device 306 is moved down to a predetermined depth of the system body 300 as determined by the results displayed on the computer monitor 116. The respectively designated slots in the second cassette 310 and/or the third cassette 316 are determined by the wafer arranging order selected in the second step.

The third step will be described in detail with reference to an embodiment in which the wafers are to be arranged according to an odd/even number order.

First, the wafer 314 loaded in the $25^{th}$ slot of the first cassette 304, which has an individual #5, is loaded onto the wafer transfer arm 312b of the wafer transfer robot 312. The wafer transfer robot 312, on which the #5 wafer 314 is loaded, is moved to a height such that the #5 wafer 314 can be horizontally transferred to the designated slot (e.g., #3 slot) of the second cassette 310. Thereafter, the wafer transfer robot 312 then rotates by 180°. Under this condition, the wafer transfer arm 312b on which the #5 wafer 314 is loaded, is moved toward the second cassette 310, so that the #5 wafer 314 is transferred into the designated slot (e.g., #3 slot) of the second cassette 310.

When the wafer 314 loaded in the $25^{th}$ slot of the first cassette 304 is not the #5 wafer but is the #6 wafer, the wafer transfer robot 312 is rotated by 90° and the wafer 314 is loaded into the #3 slot of the third cassette 316.

The aforementioned operation is repeatedly applied to the remaining 24 wafers 314 of the first cassette 304. As a result, all the wafers 314 loaded in the first cassette 304 are transferred to the second and the third cassettes 310 and 316 in the selected wafer arranging order (e.g., an odd/even number order).

In the case where the wafer transfer robot 312 has a support 312a that is only vertically movable and not rotatable, and wafer transfer arm 312b is vertically movable as well as rotatable (i.e., having similar movements to the embodiment of FIG. 7), the wafers 314 are transferred to the second and the third cassettes 310 and 316 as follows. The preparatory step and the first and second steps are the same as previously described for the second embodiment. Therefore, the description thereof will be omitted. The third step after completion of the wafer number detection and wafer arranging order selection will be described below with reference to an odd/even number wafer arrangement order.

First, #5 wafer 314 loaded in the 25$^{th}$ slot of the first cassette 304 is loaded onto the wafer transfer arm 312b of the wafer transfer robot 312 under the condition that the serial number detecting device 306 is vertically moved down to a predetermined depth of the system body 300. The wafer transfer robot 312 on which the #5 wafer 314 is loaded is moved to a height such that the #5 wafer 314 can be horizontally transferred to the designated slot (e.g., #3 slot) of the second cassette 310.

Thereafter, the support 312a of the wafer transfer robot 312 is not rotated, but the wafer transfer arm 312b is rotated by 180°. Under this condition, the wafer transfer arm 312b, on which the #5 wafer 314 is loaded, is moved toward the second cassette 310, so that the #5 wafer 314 is transferred into the designated slot (e.g., #3 slot) of the second cassette 310.

The aforementioned operation is repeatedly applied to the rest of the wafers 314 loaded in the first cassette 304. As a result, all the wafers 314 in the first cassette 304 are transferred to the second and third cassettes 310 and 316 in the selected wafer arranging order (e.g., an odd/even number order).

The second and the third embodiments of the present invention described above are capable of minimizing the distance between the wafer transfer robot and the respective cassettes.

Figure 9:
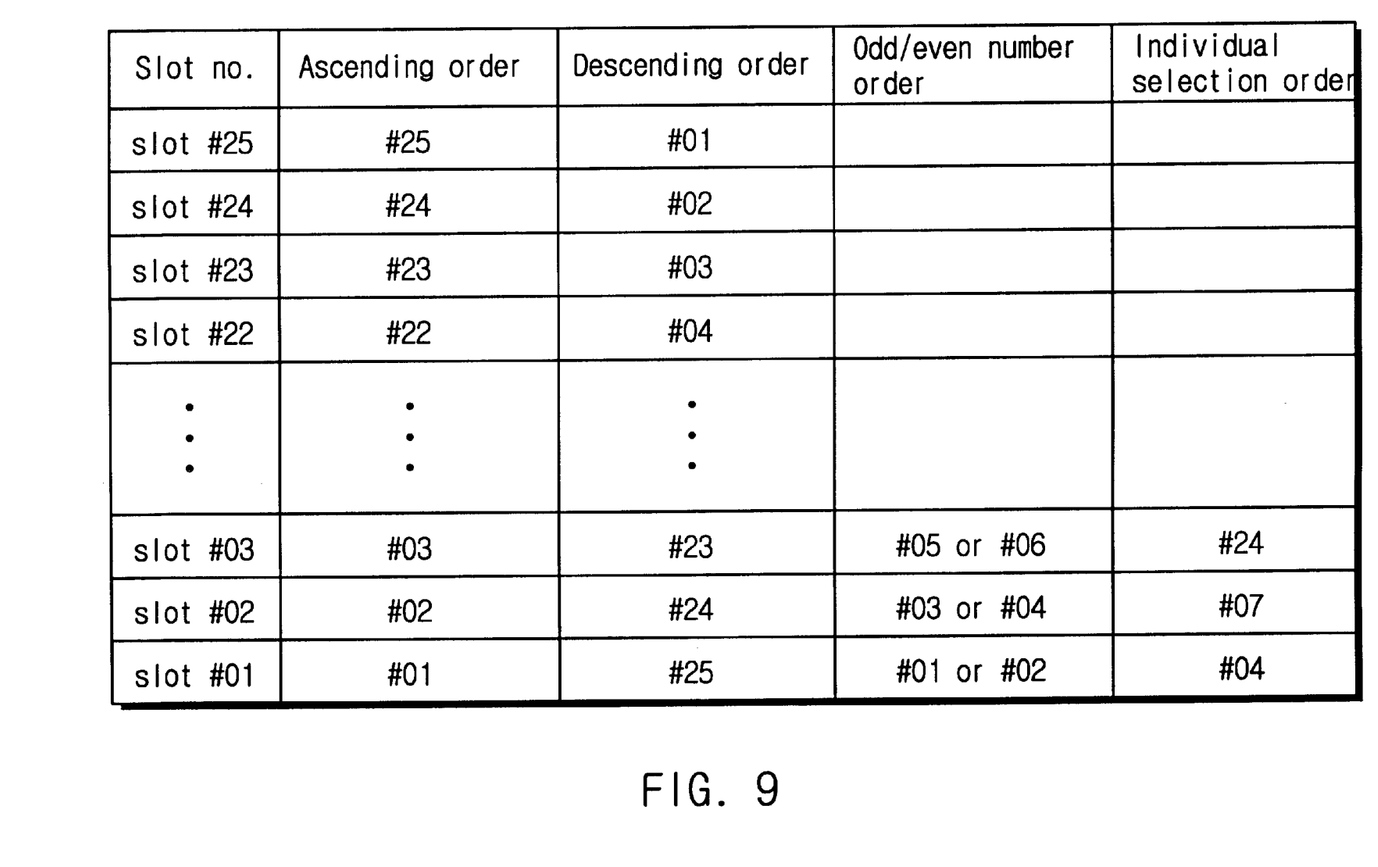
FIG. 9 is a table showing embodiments in which wafers are arranged in a designated order (an ascending order, a descending order, an odd/even number order, or an individual selection order) by the first, second and third embodiments of the wafer transfer system according to the present invention.

FIG. 9 is a table showing the details of how wafers are arranged within each designated order arrangement (an ascending order, a descending order, an odd/even number order, or an individual selection order) by the first, second and third embodiments of the wafer transfer system.

Referring to the table in FIG. 9, when wafers in a first cassette are automatically arranged in an ascending order, the wafers are loaded in a second cassette in such a manner that #1 wafer is loaded in the slot #1 and #2 wafer in the slot #2 of the second cassette. When wafers in the first cassette are automatically arranged in an descending order, the wafers are loaded in a second cassette in such a manner that #25 wafer is loaded in the slot #1 and the #24 wafer in the slot #2 of the second cassette.

When wafers are automatically arranged in an odd/even number order, the wafers are loaded in a second and a third cassettes in such a manner that #1, #3 and #5, i.e., odd number wafers, are loaded in the slots #1, #2 and #3 of the second cassette, respectively, while #2, #4 and #6 wafers, i.e., even number wafers, are loaded in the slots #1, #2 and #3 of the third cassette.

When wafers in a first cassette are automatically arranged in an individual selection order designated by an operator, the wafers are loaded in a second cassette in such a manner that, for example, #4, #7 and #24 wafers are loaded in the slots #1, #2 and #3 of the second cassette, respectively.

When the wafers are arranged in a designated order using the wafer transfer system, it is not necessary to test all the wafers after each unit process. An operator may test only several wafers at the weak points, that is, those positions in the cassette at which the wafers have a higher probability of defects. As a result, it is possible to reduce the time for the test.

Furthermore, it is possible to: 1) individually manage large diameter wafers and computerize information about each of the individual wafers; 2) analyze the properties of the respective unit processes; 3) easily determine and analyze the state of the semiconductor fabricating equipment; and 4) clearly detect changes in the properties of the processes in association with the continuity of the unit processes by automatically arranging the wafers in a designated order in the repeated unit processes.

While preferred embodiments of the present invention have been described, it will be understood by those skilled in the art that various changes and modifications may be made, and equivalents may be substituted for elements thereof without departing from the true scope of the present invention. Therefore, it is intended that the present invention not be limited to the particular embodiments disclosed, but that the present invention include all embodiments falling within the scope of the appended claims.

What is claimed is:

1. A wafer transfer system of semiconductor fabricating equipment comprising:

a system body;

a first cassette support installed at a predetermined position on said system body;

a first cassette loaded on said first cassette support and containing a plurality of wafers having serial numbers;

a serial number detecting device, installed on said system body at a first side of said first cassette, said serial number detecting device being vertically movable;

first vertical movement means for vertically moving the serial number detecting device;

a second cassette support, installed on said system body and spaced apart by a predetermined distance from said serial number detecting device, said second cassette support being vertically movable;

second vertical movement means for vertically moving the second cassette support;

a second cassette, loaded on said second cassette support, for receiving said plurality of wafers;

a wafer transfer robot having a wafer transfer arm for transferring said plurality of wafers from said first cassette to said second cassette, said wafer transfer robot being installed on said system body at a second side of said first cassette, said second side of the first cassette being opposite to said first side of the first cassette, and the wafer transfer robot being vertically movable;

third vertical movement means for vertically moving the wafer transfer robot; and a computer connected to said wafer transfer robot, said serial number detecting device, said first cassette support, said second cassette support, and said first, second and third vertical movement means, via a network system, for receiving and displaying serial numbers from said serial number detecting device, and for directing said wafer transfer robot to transfer said plurality of wafers from said first cassette into selected locations in said second cassette.

2. The wafer transfer system of claim 1, wherein said serial number detecting device has a height range of from 40 to 50 cm.

3. The wafer transfer system of claim 1, said serial number detecting device comprising:

a support bar installed on said system body; and a character recognizing part attached at a predetermined position on said support bar.

4. The wafer transfer system of claim 3, wherein said character recognizing part is fixed to be sloped by 45° with respect to a horizontal surface on which said plurality of wafers is placed.

5. The wafer transfer system of claim 1, said wafer transfer robot comprising a support installed on said system body, the wafer transfer arm being provided on top of said support.

6. The wafer transfer system of claim 5, wherein said wafer transfer arm is horizontally movable.

7. The wafer transfer system of claim 5, wherein said wafer transfer arm has a length range of from 33 to 37 cm.

8. The wafer transfer system of claim 5, wherein said support has a height range of from 28 to 30 cm.

9. The wafer transfer system of claim 1, wherein each of said first and said second cassettes has an open side into which said plurality of wafers is received and through which said plurality of wafers is removed, and said open side of each of said first and second cassettes are located opposite to each other on said system body.

10. A wafer transfer system of semiconductor fabricating equipment comprising:

a system body;

first and second cassette supports installed on said system body, said first cassette support being spaced apart from said second cassette support by a predetermined distance;

a first cassette loaded on said first cassette support and containing a plurality of wafers having serial numbers;

a second cassette loaded on said second cassette support for receiving said plurality of wafers;

a wafer transfer robot having a wafer transfer arm for transferring said plurality of wafers from said first cassette to said second cassette, said wafer transfer robot being installed on said system body between said first and said second cassettes, said wafer transfer robot being vertically movable and rotatable;

movement means for vertically and rotatable moving the wafer transfer robot;

a serial number detecting device, installed on said system body between said wafer transfer robot and said first cassette, said serial number detecting device being vertically movable;

vertical movement means for vertically moving the serial number detecting device; and a computer connected to said wafer transfer robot, said serial number detecting device, said first cassette support, said second cassette support, said movement means, and said vertical movement means, via a network system, for receiving and displaying serial numbers from said serial number detecting device, and for directing said wafer transfer robot to transfer said plurality of wafers from said first cassette into selected locations in said second cassette.

11. The wafer transfer system of claim 10, wherein said wafer transfer robot is rotatable by 180°.

12. The wafer transfer system of claim 10, wherein said serial number detecting device has a height range of from 40 to 50 cm.

13. The wafer transfer system of claim 10, said serial number detecting device comprising:

a support bar installed on said system body; and a character recognizing part attached at a predetermined position on said support bar.

14. The wafer transfer system of claim 13, wherein said character recognizing part is fixed to be sloped by 45° with respect to a horizontal surface on which said plurality of wafers is placed.

15. The wafer transfer system of claim 10, said wafer transfer robot comprising a support installed on said system body, the wafer transfer arm being provided on top of said support.

16. The wafer transfer system of claim 15, wherein said wafer transfer arm is horizontally movable.

17. The wafer transfer system of claim 15, wherein said wafer transfer arm has a length range of from 22 to 24 cm.

18. The wafer transfer system of claim 15, wherein said support has a height range of from 28 to 30 cm.

19. The wafer transfer system of claim 10, wherein each of said first and said second cassettes has an open side into which said plurality of wafers is received and through which said plurality of wafers is removed, and said open side of each of said first and second cassettes are located opposite to each other on said system body.

20. A wafer transfer system of semiconductor fabricating equipment comprising:

a system body;

first and second cassette supports installed on said system body, said first cassette support being spaced apart from said second cassette support by a predetermined distance;

a first cassette loaded on said first cassette support and containing a plurality of wafers having serial numbers;

a second cassette loaded on said second cassette support for receiving said plurality of wafers;

a wafer transfer robot having a wafer transfer arm for transferring said plurality of wafers from said first cassette to said second cassette, said wafer transfer robot being installed on said system body between said first and second cassettes, said wafer transfer robot being vertically movable;

first vertical movement means for vertically moving the wafer transfer robot;

a serial number detecting device, installed on said system body between said wafer transfer robot and said first cassette, said serial number detecting device being vertically movable;

second vertical movement means for vertically moving the serial number detecting device; and a computer connected to said wafer transfer robot, said serial number detecting device, said first cassette and said second cassette support via a network system, and said first and second vertical movement means, for receiving and displaying serial numbers from said serial number detecting device, and for directing said wafer transfer robot to transfer said plurality of wafers from said first cassette into selected locations in said second cassette.

21. The wafer transfer system of claim 20, said wafer transfer robot comprising a support installed on said system body, the wafer transfer arm being provided on top of said support.

22. The wafer transfer system of claim 21, wherein said wafer transfer arm is horizontally movable and rotatable.

23. The wafer transfer system of claim 22, wherein said wafer transfer arm is rotatable by 180°.

24. The wafer transfer system of claim 22, wherein said wafer transfer arm has a length range of from 22 to 24 cm.

25. The wafer transfer system of claim 21, wherein said support has a height range of from 28 to 30 cm.

26. The wafer transfer system of claim 20, wherein said serial number detecting device has a height range of from 40 to 50 cm.

27. The wafer transfer system of claim 20, said serial number detecting device comprising:
   a support bar installed on said system body; and
   a character recognizing part attached at a predetermined position on said support bar.

28. The wafer transfer system of claim 27, wherein said character recognizing part is fixed to be sloped by 45° with respect to a horizontal surface on which said plurality of wafers is placed.

29. The wafer transfer system of claim 20, wherein each of said first and second cassettes has an open side into which said plurality of wafers is received and through which said plurality of wafers is removed, and said open side of each of said first and second cassettes are located opposite to each other on said system body.

30. A wafer transfer system of semiconductor fabricating equipment comprising:
   a system body;
   first, second and third cassette supports installed on said system body, said first, second and third cassette supports being spaced apart from each other by predetermined distances;
   a first cassette loaded on said first cassette support and containing a plurality of wafers having serial numbers;
   a second cassette and a third cassette respectively loaded on said second and third cassette supports for receiving said plurality of wafers;
   a wafer transfer robot having a wafer transfer arm for transferring said plurality of wafers from said first cassette to said second and third cassettes, said wafer transfer robot being installed on said system body between said first and second cassettes, said wafer transfer robot being vertically movable and rotatable;
   movement means for vertically and rotatably moving the wafer transfer robot;
   a serial number detecting device, installed on said system body between said wafer transfer robot and said first cassette, said serial number detecting device being vertically movable;
   vertical movement means for vertically moving the serial number detecting device; and
   a computer connected to said wafer transfer robot, said serial number detecting device, said first, second and third cassette supports, said movement means and said vertical movement means, via a network system, for receiving and displaying serial numbers from said serial number detecting device, and for directing said wafer transfer robot to transfer said plurality of wafers from said first cassette into selected locations in said second and third cassettes.

31. The wafer transfer system of claim 30, wherein each of said first, second and third cassettes has an open side into which said plurality of wafers is received and through which said plurality of wafers is removed, and said open side of each of said first and second cassettes are located opposite to each other, and said open side of said third cassette is located on a line perpendicularly extending from a center point of a line connecting center points of said open sides of said first and second cassettes.

32. The wafer transfer system of claim 31, wherein said predetermined distances by which said first, second and third cassettes are spaced apart from each other is a common distance.

33. The wafer transfer system of claim 30, wherein said wafer transfer robot is rotatable by either 90° or 180°.

34. The wafer transfer system of claim 30, wherein said serial number detecting device has a height range of from 40 to 50 cm.

35. The wafer transfer system of claim 30, said serial number detecting device comprising:
   a support bar installed on said system body; and
   a character recognizing part attached at a predetermined position on said support bar.

36. The wafer transfer system of claim 35, wherein said character recognizing part is fixed to be sloped by 45° with respect to a horizontal surface on which said plurality of wafers is placed.

37. The wafer transfer system of claim 30, said wafer transfer robot comprising a support installed on said system body, the wafer transfer arm being provided on top of said support.

38. The wafer transfer system of claim 37, wherein said wafer transfer arm is horizontally movable.

39. The wafer transfer system of claim 37, wherein said wafer transfer arm has a length range of from 22 to 24 cm.

40. The wafer transfer system of claim 37, wherein said support has a height range of from 28 to 30 cm.

41. A wafer transfer system of semiconductor fabricating equipment comprising:
   a system body;
   first, second and third cassette supports installed on said system body, said first, second and third cassette supports being spaced apart from each other by predetermined distances;
   a first cassette loaded on said first cassette support and containing a plurality of wafers having serial numbers;
   a second cassette and a third cassette respectively loaded on said second and said third cassette supports for receiving said plurality of wafers;
   a wafer transfer robot for transferring said plurality of wafers from said first cassette to said second and third cassettes, said wafer transfer robot being installed on said system body between said first and second cassettes, said wafer transfer robot being vertically movable;
   first vertical movement means for vertically moving the wafer transfer robot;
   a serial number detecting device, installed on said system body between said wafer transfer robot and said first cassette, said serial number detecting device being vertically movable;
   second vertical movement means for vertically moving the serial number detecting device; and
   a computer connected to said wafer transfer robot, said serial number detecting device, said first, second and third cassette supports, and said first and second vertical movement means, via a network system, for receiving and displaying serial numbers from said serial number detecting device, and for directing said wafer transfer robot to transfer said plurality of wafers from said first cassette into selected locations in said second and third cassettes.

42. The wafer transfer system of claim 41, said wafer transfer robot comprising a support installed on said system body, the wafer transfer arm being provided on top of said support.

43. The wafer transfer system of claim 42, wherein said wafer transfer arm is horizontally movable and rotatable.

44. The wafer transfer system of claim 42, wherein said wafer transfer arm is rotatable by either 90° or 180°.

45. The wafer transfer system of claim 42, wherein said wafer transfer arm has a length range of from 22 to 24 cm.

46. The wafer transfer system of claim 42, wherein said support has a height range of from 28 to 30 cm.

47. The wafer transfer system of claim 41, wherein said serial number detecting device has a height range of from 40 to 50 cm.

48. The wafer transfer system of claim 41, said serial number detecting device comprising:

a support bar installed on said system body; and a character recognizing part attached at a predetermined position on said support bar.

49. The wafer transfer system of claim 48, wherein said character recognizing part is fixed to be sloped by 45° with respect to a horizontal surface on which said plurality of wafers is placed.

50. The wafer transfer system of claim 41, wherein each of said first, second and third cassettes has an open side into which said plurality of wafers is received and through which said plurality of wafers is removed, and said open side of each of said first and second cassettes are located opposite to each other, and said open side of said third cassette is located on a line perpendicularly extending from a center point of a line connecting center points of said open sides of said first and second cassettes.

51. The wafer transfer system of claim 50, wherein said predetermined distances by which said first, second and third cassettes spaced apart from each other is a common distance.

* * * * *